US012652932B2

(12) United States Patent
Qian

(10) Patent No.: US 12,652,932 B2
(45) Date of Patent: Jun. 9, 2026

(54) MANUFACTURING METHOD OF OLED DISPLAY PANE AND OLED DISPLAY PANEL

(71) Applicant: Shenzhen China Star Optoelectronics Semiconductor Display Technology Co., Ltd., Shenzhen (CN)

(72) Inventor: Jiajia Qian, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 78 days.

(21) Appl. No.: 17/776,378

(22) PCT Filed: Apr. 19, 2022

(86) PCT No.: PCT/CN2022/087555
§ 371 (c)(1),
(2) Date: Sep. 28, 2023

(87) PCT Pub. No.: WO2023/178774
PCT Pub. Date: Sep. 28, 2023

(65) Prior Publication Data
US 2024/0155919 A1 May 9, 2024

(30) Foreign Application Priority Data
Mar. 23, 2022 (CN) .......................... 202210291497.1

(51) Int. Cl.
*H10K 59/80* (2023.01)
*H10K 59/12* (2023.01)
*H10K 59/122* (2023.01)

(52) U.S. Cl.
CPC ....... *H10K 59/873* (2023.02); *H10K 59/1201* (2023.02); *H10K 59/122* (2023.02)

(58) Field of Classification Search
CPC . H10K 59/873; H10K 59/1201; H10K 59/122
See application file for complete search history.

(56) References Cited

U.S. PATENT DOCUMENTS

2021/0210725 A1 7/2021 Choi
2022/0077257 A1 3/2022 Choung

FOREIGN PATENT DOCUMENTS

CN 107403883 A 11/2017
CN 107808896 A 3/2018
(Continued)

OTHER PUBLICATIONS

International Search Report in International application No. PCT/CN2022/087555, mailed on Nov. 30, 2022.
(Continued)

*Primary Examiner* — Joseph L Williams
(74) *Attorney, Agent, or Firm* — Nathan & Associates; Menachem Nathan

(57) ABSTRACT
A manufacturing method of an organic light-emitting diode (OLED) display panel and an OLED display panel are provided. In embodiments of the manufacturing method of the OLED display panel, no mask is used in processes of forming a first light-emitting layer, a second light-emitting layer, a third light-emitting layer, a first cathode, a second cathode, a third cathode, a first inorganic encapsulation layer, a second inorganic encapsulation layer, and a third inorganic encapsulation layer, so that a manufacturing cost of the OLED display panel can be reduced.

20 Claims, 5 Drawing Sheets

100

(56)     References Cited

FOREIGN PATENT DOCUMENTS

| CN | 108231859 A |   | 6/2018  |            |
|----|-------------|---|---------|------------|
| CN | 109742125 A |   | 5/2019  |            |
| CN | 110165074 A |   | 8/2019  |            |
| CN | 111326677 A | * | 6/2020  | H10K 59/122 |
| CN | 112885885 A |   | 6/2021  |            |
| CN | 113497203 A |   | 10/2021 |            |

OTHER PUBLICATIONS

Written Opinion of the International Search Authority in International application No. PCT/CN2022/087555,mailed on Nov. 30, 2022.
Chinese Office Action issued in corresponding Chinese Patent Application No. 202210291497.1 dated Jul. 31, 2024, pp. 1-9.

* cited by examiner

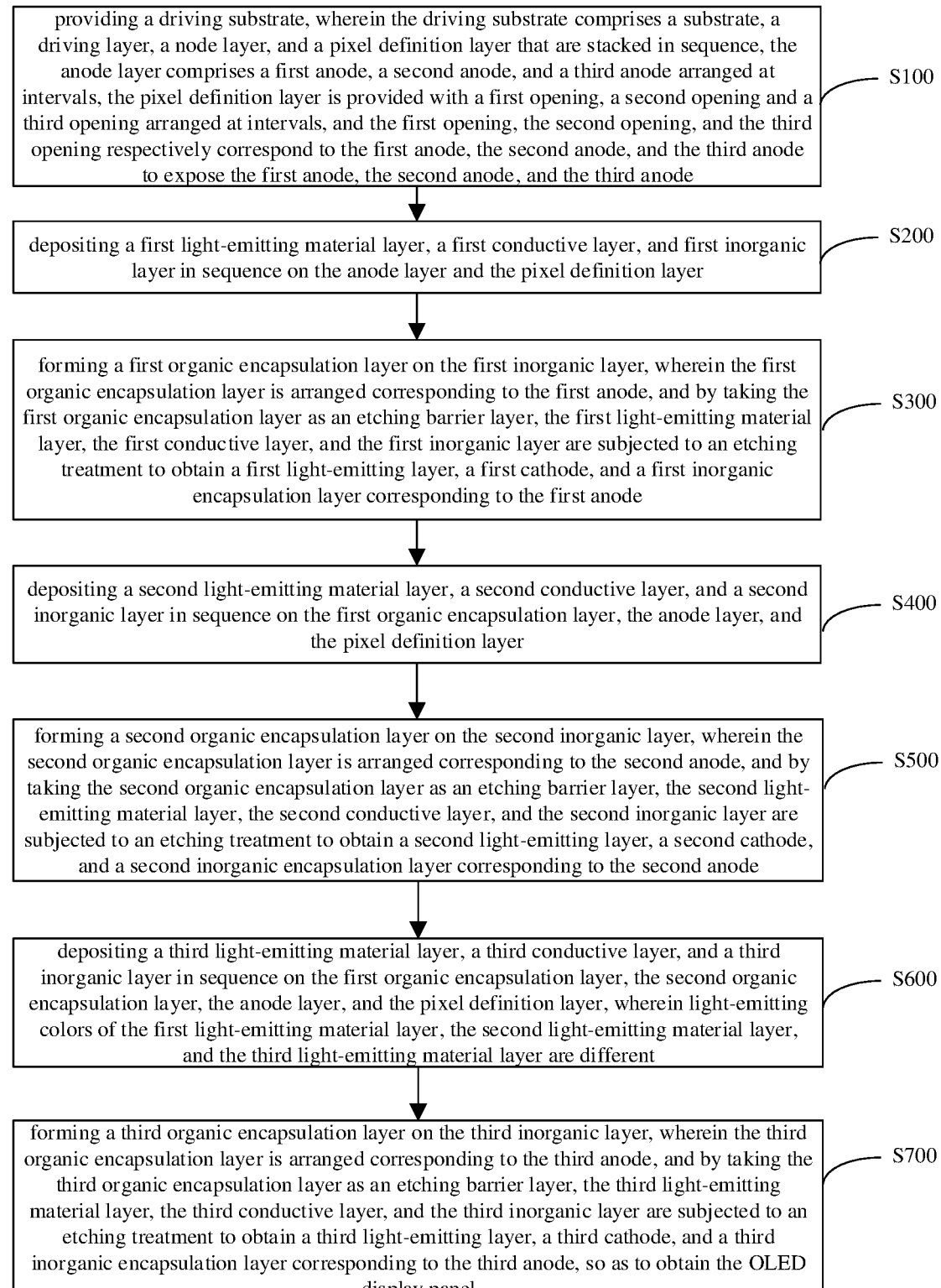

providing a driving substrate, wherein the driving substrate comprises a substrate, a driving layer, a node layer, and a pixel definition layer that are stacked in sequence, the anode layer comprises a first anode, a second anode, and a third anode arranged at intervals, the pixel definition layer is provided with a first opening, a second opening and a third opening arranged at intervals, and the first opening, the second opening, and the third opening respectively correspond to the first anode, the second anode, and the third anode to expose the first anode, the second anode, and the third anode — S100 depositing a first light-emitting material layer, a first conductive layer, and first inorganic layer in sequence on the anode layer and the pixel definition layer — S200 forming a first organic encapsulation layer on the first inorganic layer, wherein the first organic encapsulation layer is arranged corresponding to the first anode, and by taking the first organic encapsulation layer as an etching barrier layer, the first light-emitting material layer, the first conductive layer, and the first inorganic layer are subjected to an etching treatment to obtain a first light-emitting layer, a first cathode, and a first inorganic encapsulation layer corresponding to the first anode — S300 depositing a second light-emitting material layer, a second conductive layer, and a second inorganic layer in sequence on the first organic encapsulation layer, the anode layer, and the pixel definition layer — S400 forming a second organic encapsulation layer on the second inorganic layer, wherein the second organic encapsulation layer is arranged corresponding to the second anode, and by taking the second organic encapsulation layer as an etching barrier layer, the second light-emitting material layer, the second conductive layer, and the second inorganic layer are subjected to an etching treatment to obtain a second light-emitting layer, a second cathode, and a second inorganic encapsulation layer corresponding to the second anode — S500 depositing a third light-emitting material layer, a third conductive layer, and a third inorganic layer in sequence on the first organic encapsulation layer, the second organic encapsulation layer, the anode layer, and the pixel definition layer, wherein light-emitting colors of the first light-emitting material layer, the second light-emitting material layer, and the third light-emitting material layer are different — S600 forming a third organic encapsulation layer on the third inorganic layer, wherein the third organic encapsulation layer is arranged corresponding to the third anode, and by taking the third organic encapsulation layer as an etching barrier layer, the third light-emitting material layer, the third conductive layer, and the third inorganic layer are subjected to an etching treatment to obtain a third light-emitting layer, a third cathode, and a third inorganic encapsulation layer corresponding to the third anode, so as to obtain the OLED display panel — S700

MANUFACTURING METHOD OF OLED DISPLAY PANE AND OLED DISPLAY PANEL

FIELD OF DISCLOSURE

The present disclosure relates to the field of displays, in particular to a manufacturing method of an organic light-emitting diode (OLED) display panel and an OLED display panel.

BACKGROUND

Organic light-emitting diode (OLED) displays have characteristics of active light emission, high brightness, high contrast, low power consumption, wide viewing angles, fast response speed, wide operating temperature range, thin and light, etc., and are widely used in the display field.

SUMMARY OF DISCLOSURE

In an existing manufacturing method of the OLED display panel, an evaporation method combined with a mask is usually used to form a patterned light-emitting layer when forming an OLED device, and a chemical vapor deposition method combined with a mask is usually used to form a patterned inorganic encapsulation layer when forming an encapsulation structure of the OLED device. Due to problems of manufacturing deviation, alignment deviation, and thermal deformation of the mask itself, a film forming position of the light-emitting layer and the inorganic encapsulation layer will be greatly offset from a preset position. Moreover, a cost of the mask is relatively high, which leads to a relatively high manufacturing cost of the OLED display panel.

Embodiments of the present disclosure provide a manufacturing method of an OLED display panel and an OLED display panel, which can reduce a manufacturing cost of an OLED display panel, and prevent problems such as a large offset between a film forming position and a preset position of a film layer caused by the use of a mask.

In a first aspect, an embodiment of the present disclosure provides a manufacturing method of an OLED display panel, including:

providing a driving substrate, where the driving substrate includes a substrate, a driving layer, an anode layer, and a pixel definition layer that are stacked in sequence, the anode layer includes a first anode, a second anode, and a third anode arranged at intervals, the pixel definition layer is provided with a first opening, a second opening and a third opening arranged at intervals, and the first opening, the second opening, and the third opening respectively correspond to the first anode, the second anode, and the third anode to expose the first anode, the second anode, and the third anode;

depositing a first light-emitting material layer, a first conductive layer, and first inorganic layer in sequence on the anode layer and the pixel definition layer;

forming a first organic encapsulation layer on the first inorganic layer, where the first organic encapsulation layer is arranged corresponding to the first anode, and by taking the first organic encapsulation layer as an etching barrier layer, the first light-emitting material layer, the first conductive layer, and the first inorganic layer are subjected to an etching treatment to obtain a first light-emitting layer, a first cathode, and a first inorganic encapsulation layer corresponding to the first anode;

depositing a second light-emitting material layer, a second conductive layer, and a second inorganic layer in sequence on the first organic encapsulation layer, the anode layer, and the pixel definition layer;

forming a second organic encapsulation layer on the second inorganic layer, where the second organic encapsulation layer is arranged corresponding to the second anode, and by taking the second organic encapsulation layer as an etching barrier layer, the second light-emitting material layer, the second conductive layer, and the second inorganic layer are subjected to an etching treatment to obtain a second light-emitting layer, a second cathode, and a second inorganic encapsulation layer corresponding to the second anode;

depositing a third light-emitting material layer, a third conductive layer, and a third inorganic layer in sequence on the first organic encapsulation layer, the second organic encapsulation layer, the anode layer, and the pixel definition layer, where light-emitting colors of the first light-emitting material layer, the second light-emitting material layer, and the third light-emitting material layer are different from each other; and forming a third organic encapsulation layer on the third inorganic layer, where the third organic encapsulation layer is arranged corresponding to the third anode, and by taking the third organic encapsulation layer as an etching barrier layer, the third light-emitting material layer, the third conductive layer, and the third inorganic layer are subjected to an etching treatment to obtain a third light-emitting layer, a third cathode, and a third inorganic encapsulation layer corresponding to the third anode, so as to obtain the OLED display panel.

In some embodiments, the first organic encapsulation layer is formed on the first inorganic layer by an inkjet printing method, the second organic encapsulation layer is formed on the second inorganic layer by the inkjet printing method, and the third organic encapsulation layer is formed on the third inorganic layer by the inkjet printing method.

In some embodiments, materials of the first organic encapsulation layer, the second organic encapsulation layer, and the third organic encapsulation layer each include either one or both of polymethyl methacrylate and epoxy resin.

In some embodiments, the first light-emitting material layer, the second light-emitting material layer, and the third light-emitting material layer are formed by means of evaporation, coating, or printing.

In some embodiments, the first conductive layer, the second conductive layer, and the third conductive layer are formed by means of evaporation, coating, or printing.

In some embodiments, the first inorganic layer, the second inorganic layer, and the third inorganic layer are formed by means of plasma enhanced chemical vapor deposition, sputtering, or atomic layer deposition.

In some embodiments, materials of the first inorganic layer, the second inorganic layer, and the third inorganic layer each include one or more of silicon nitride, silicon oxide, and silicon oxynitride.

In some embodiments, after obtaining the third light-emitting layer, the third cathode, and the third inorganic encapsulation layer corresponding to the third anode, a fourth inorganic encapsulation layer is formed on the first organic encapsulation layer, the second organic encapsulation layer, the third organic encapsulation layer, and the pixel definition layer.

In some embodiments, material of the fourth inorganic encapsulation layer includes one or more of silicon nitride, silicon oxide, and silicon oxynitride.

In a second aspect, an embodiment of the present disclosure provides an organic light-emitting diode (OLED) display panel, including:

a substrate;

a driving layer disposed on a side of the substrate;

a first OLED device disposed on a side of the driving layer away from the substrate, where the first OLED device includes a first anode, a first light-emitting layer, and a first cathode that are stacked in sequence;

a second OLED device disposed on a side of the driving layer away from the substrate, where the second OLED device includes a second anode, a second light-emitting layer, and a second cathode that are stacked in sequence;

a third OLED device disposed on a side of the driving layer away from the substrate, where the third OLED device includes a third anode, a third light-emitting layer, and a third cathode that are stacked in sequence, and light-emitting colors of the first light-emitting layer, the second light-emitting layer, and the third light-emitting layer are different from each other;

a pixel definition layer disposed on a side of the driving layer away from the substrate, where the pixel definition layer is disposed in a spaced region between the first OLED device, the second OLED device, and the third OLED device;

a first encapsulation structure, where the first encapsulation structure is disposed on a side of the first OLED device away from the driving layer, and the first encapsulation structure includes a first inorganic encapsulation layer and a first organic encapsulation layer arranged in layers;

a second encapsulation structure, where the second encapsulation structure is disposed on a side of the second OLED device away from the driving layer, and the second encapsulation structure includes a second inorganic encapsulation layer and a second organic encapsulation layer arranged in layers; and a third encapsulation structure, where the third encapsulation structure is disposed on a side of the third OLED device away from the driving layer, and the third encapsulation structure includes a third inorganic encapsulation layer and a third organic encapsulation layer arranged in layers.

In some embodiments, materials of the first inorganic encapsulation layer, the second inorganic encapsulation layer, and the third inorganic encapsulation layer each include one or more of silicon nitride, silicon oxide, and silicon oxynitride.

In some embodiments, materials of the first organic encapsulation layer, the second organic encapsulation layer, and third organic encapsulation layer each include either one or both of polymethyl methacrylate and epoxy resin.

In some embodiments, the OLED display panel further includes a fourth inorganic encapsulation layer, the fourth inorganic encapsulation layer is disposed on a side of the first organic encapsulation layer, the second organic encapsulation layer, the third organic encapsulation layer, and the pixel definition layer away from the driving layer.

In some embodiments, material of the fourth inorganic encapsulation layer includes one or more of silicon nitride, silicon oxide and silicon oxynitride.

In the manufacturing method of the OLED display panel of the embodiments of the present disclosure, by taking the first organic encapsulation layer as the etching barrier layer, the first light-emitting material layer, the first conductive layer, and the first inorganic layer are subjected to the etching treatment to obtain the first light-emitting layer, the first cathode, and the first inorganic encapsulation layer. By taking the second organic encapsulation layer as the etching barrier layer, the second light-emitting material layer, the second conductive layer, and the second inorganic layer are subjected to the etching treatment to obtain the second light-emitting layer, the second cathode, and the second inorganic encapsulation layer. By taking the third organic encapsulation layer as the etching barrier layer, the third light-emitting material layer, the third conductive layer, and the third inorganic layer are subjected to the etching treatment to obtain the third light-emitting layer, the third cathode, and the third inorganic encapsulation layer. That is, in the embodiments of the present disclosure, no mask is used in processes of forming the first light-emitting layer, the second light-emitting layer, the third light-emitting layer, the first cathode, the second cathode, the third cathode, the first inorganic encapsulation layer, the second inorganic encapsulation layer, and the third inorganic encapsulation layer, so that a manufacturing cost of the OLED display panel can be reduced. Moreover, a problem of a large offset between a film forming position and a preset position of a film layer caused by the use of a mask is prevented.

BRIEF DESCRIPTION OF DRAWINGS

In order to more clearly illustrate technical solutions in the embodiments of the present disclosure, the following will briefly introduce accompanying drawings used in the description of the embodiments. The drawings in the following description are only some examples of the present disclosure. For those skilled in the art, other drawings can also be obtained from these drawings without creative efforts.

FIG. 1 is a flowchart of a manufacturing method of an OLED display panel according to an embodiment of the present disclosure.

DETAILED DESCRIPTION

The technical solutions in the embodiments of the present disclosure will be clearly and completely described below with reference to the accompanying drawings in the embodiments of the present disclosure. Obviously, the described embodiments are only some, but not all, embodiments of the present disclosure. Based on the embodiments in the present disclosure, all other embodiments obtained by those skilled in the art without creative efforts shall fall within the protection scope of the present disclosure.

Figure 2:
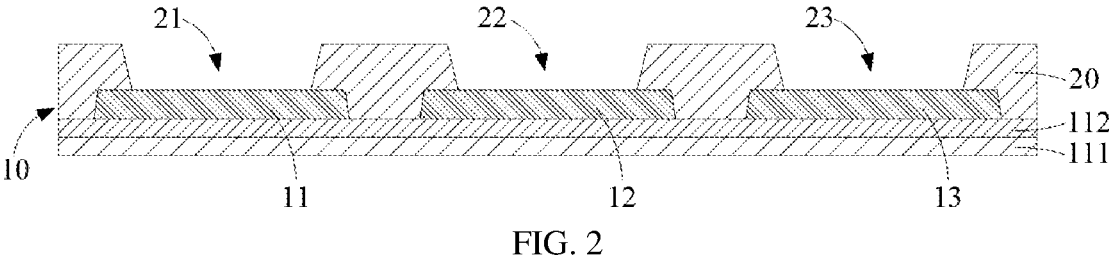
FIG. 2 is a schematic structural diagram of a driving substrate according to an embodiment of the present disclosure.

Referring to FIG. 1, FIG. 1 is a flowchart of a manufacturing method of an OLED display panel according to an embodiment of the present disclosure. The embodiment of the present disclosure provides a manufacturing method of an OLED display panel, including:

S100, refer to FIG. 2, a driving substrate 10 is provided, and the driving substrate 10 includes a substrate 111, a driving layer 112, an anode layer, and a pixel definition layer 20 that are stacked in sequence. The anode layer includes a first anode 11, a second anode 12, and a third anode 13 arranged at intervals. The pixel definition layer 20 is provided with a first opening 21, a second opening 22, and a third opening 23 which are arranged at intervals. The first anode opening 21, the second opening 22, and the third opening 23 respectively correspond to the first anode 11, the second anode 12, and the third anode 13 to expose the first anode 11, the second anode 12, and the third anode 13.

Exemplarily, the substrate 111 may be a rigid substrate or a flexible substrate, material of the rigid substrate may be glass, and material of the flexible substrate may be a polymer material such as polyimide.

Exemplarily, the driving layer 112 may include a plurality of thin film transistors (TFTs), so that the TFTs can be used to drive an OLED device.

Exemplarily, material of the anode is a conductive metal oxide, such as indium tin oxide (ITO).

Figure 3:
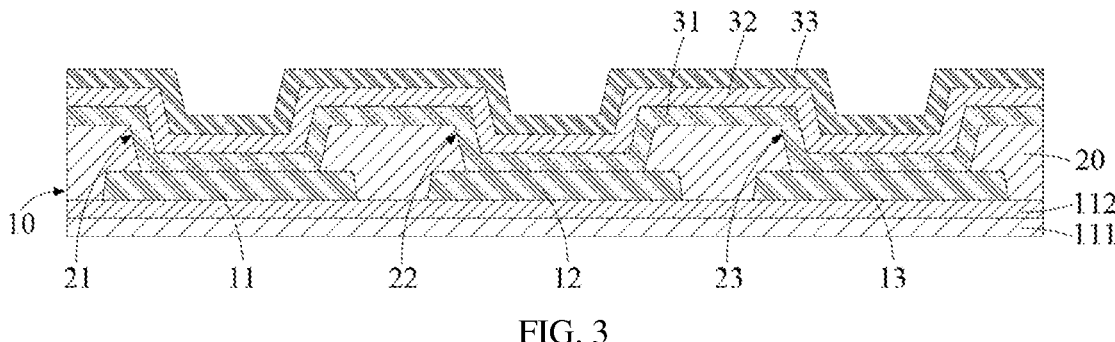
FIG. 3 is a schematic diagram of depositing a first light-emitting material layer, a first conductive layer, and a first inorganic layer according to an embodiment of the present disclosure.

S200, refer to FIG. 3, a first light-emitting material layer 31, a first conductive layer 32, and a first inorganic layer 33 are sequentially deposited on the anode layer and the pixel definition layer 20.

It can be understood that the first light-emitting material layer 31, the first conductive layer 32, and the first inorganic layer 33 are all formed on the whole surface, and a mask is not required.

Exemplarily, the first light-emitting material layer 31 can be formed by means of evaporation, coating, or printing.

Exemplarily, the first conductive layer 32 can be formed by means of evaporation, coating, or printing.

Exemplarily, material of the first conductive layer 32 may be metals. In some embodiments, the first conductive layer 32 may be a single-layer structure. Material of the single-layer structure may be a magnesium-silver alloy. In other embodiments, the first conductive layer 32 may be a double-layer structure. The double-layer structure may include a silver layer and an indium zinc oxide (IZO) layer.

Exemplarily, the first inorganic layer 33 may be formed by methods such as plasma enhanced chemical vapor deposition (PECVD), sputtering (sputter), atomic layer deposition (ALD).

Exemplarily, material of the first inorganic layer 33 may be one or more of silicon nitride (SiNx), silicon oxide (SiOx), and silicon oxynitride (SiOxNy).

Figure 4:
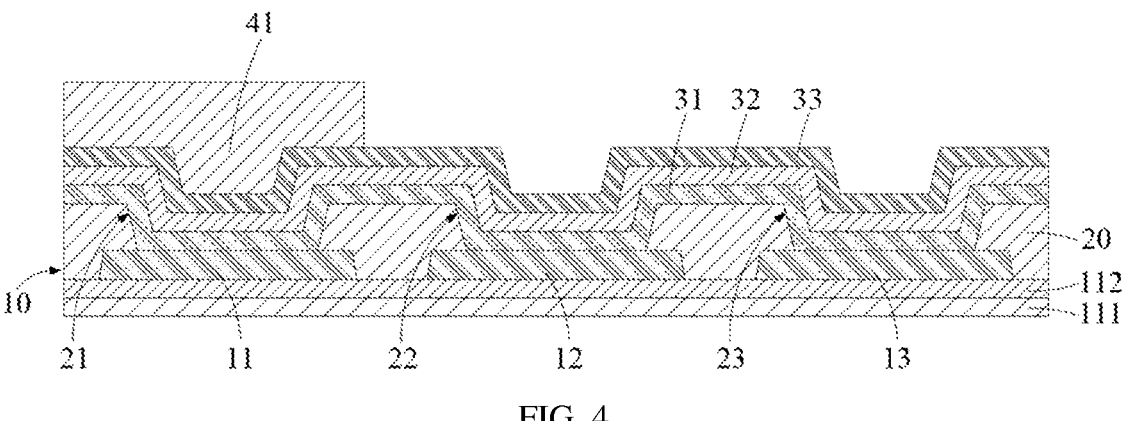
FIG. 4 is a schematic diagram of forming a first organic encapsulation layer on a first inorganic layer according to an embodiment of the present disclosure.
Figure 5:
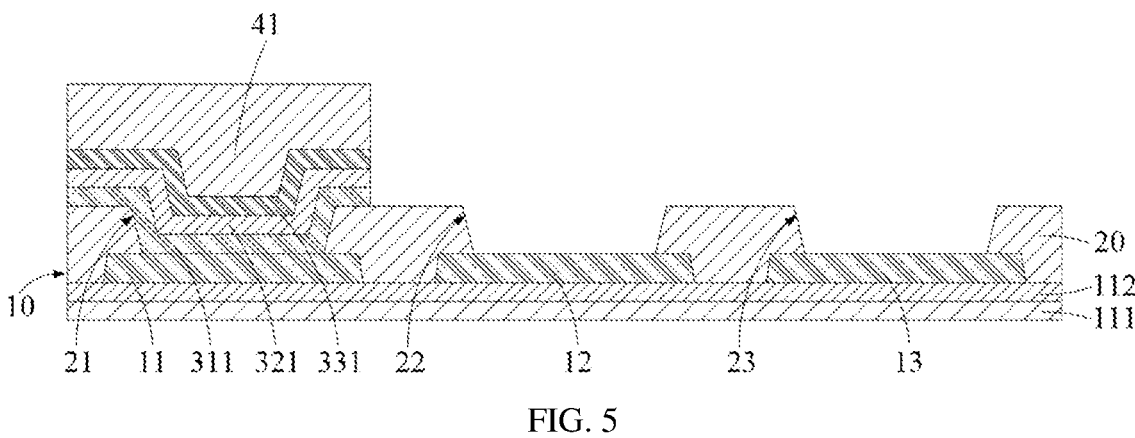
FIG. 5 is a schematic diagram after etching a first light-emitting material layer, a first conductive layer, and a first inorganic layer according to an embodiment of the present disclosure.

S300, refer to FIG. 4, a first organic encapsulation layer 41 is formed on the first inorganic layer 33. The first organic encapsulation layer 41 is disposed corresponding to the first anode 11. Referring to FIG. 5, by taking the first organic encapsulation layer 41 as an etching barrier layer, the first light-emitting material layer 31, the first conductive layer 32, and the first inorganic layer 33 are subjected to an etching treatment to obtain a first light-emitting layer 311, a first cathode 321, and a first inorganic encapsulation layer 331 corresponding to the first anode 11.

It is understandable that serving the first organic encapsulation layer 41 as the etching barrier layer to perform the etching treatment on the first light-emitting material layer 31, the first conductive layer 32, and the first inorganic layer 33 is equivalent to omitting the use of a mask in patterning processes of the first light-emitting material layer 31, the first conductive layer 32, and the first inorganic layer 33. Thus, a manufacturing cost can be saved, and a problem of a large offset between a film forming position and a preset position of a film layer caused by the use of a mask is prevented.

Exemplarily, an inkjet printing method can be used to form the first organic encapsulation layer 41 on the first inorganic layer 33. It can be understood that, by setting programs in an inkjet printer, the patterned first organic encapsulation layer 41 can be directly formed in a setting region.

Exemplarily, material of the first organic encapsulation layer 41 may be one or more of polymethyl methacrylate (PMMA) and epoxy resin.

Exemplarily, the etching treatment may be performed on the first light-emitting material layer 31, the first conductive layer 32, and the first inorganic layer 33 by dry etching, wet etching, or a combination of dry etching and wet etching.

Figure 6:
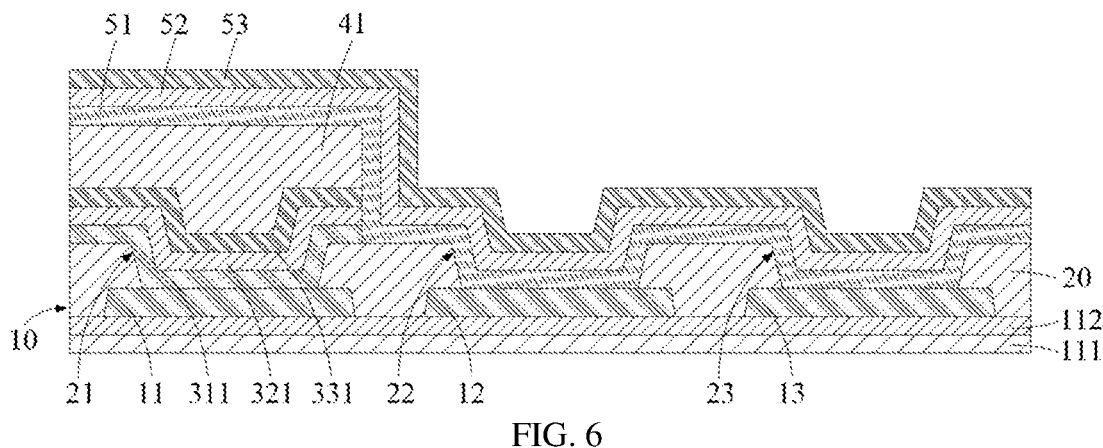
FIG. 6 is a schematic diagram of depositing a second light-emitting material layer, a second conductive layer, and a second inorganic layer according to an embodiment of the present disclosure.

S400, refer to FIG. 6, a second light-emitting material layer 51, a second conductive layer 52, and a second inorganic layer 53 are sequentially deposited on the first organic encapsulation layer 41, the anode layer, and the pixel definition layer 20.

It can be understood that the second light-emitting material layer 51, the second conductive layer 52, and the second inorganic layer 53 are all formed on the whole surface, and a mask is not required.

Exemplarily, the second light-emitting material layer 51 can be formed by means of evaporation, coating, or printing.

Exemplarily, the second conductive layer 52 can be formed by means of evaporation, coating, or printing.

Exemplarily, material of the second conductive layer 52 may be metals. In some embodiments, the second conductive layer 52 may have a single-layer structure, and material of the single-layer structure may be a magnesium-silver alloy. In other embodiments, the second conductive layer 52 may have a double-layer structure, and the double-layer structure may include a silver layer and an indium zinc oxide (IZO) layer.

Exemplarily, the second inorganic layer 53 can be formed by methods such as plasma enhanced chemical vapor deposition (PECVD), sputtering, and atomic layer deposition (ALD).

Exemplarily, material of the second inorganic layer 53 may be one or more of silicon nitride (SiNx), silicon oxide (SiOx), and silicon oxynitride (SiOxNy).

Figure 7:
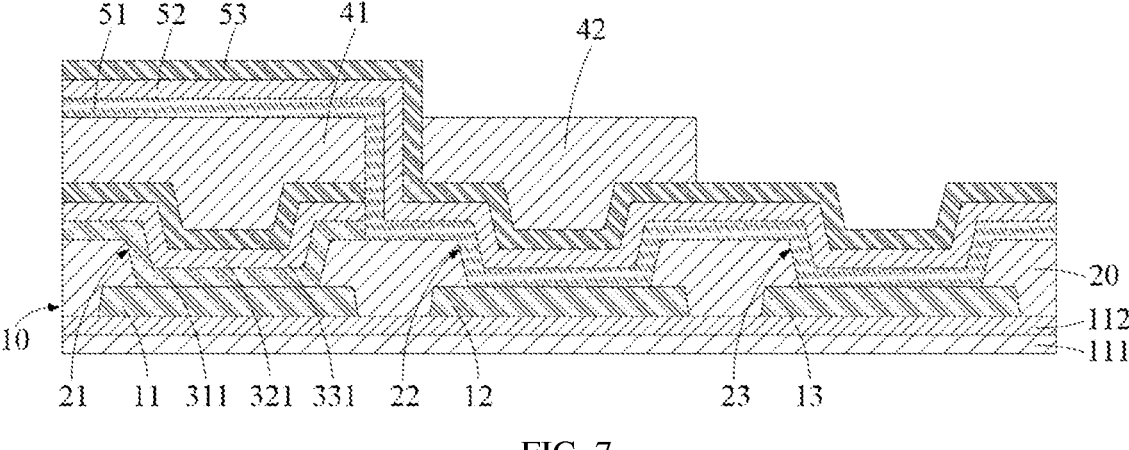
FIG. 7 is a schematic diagram of forming a second organic encapsulation layer on a second inorganic layer according to an embodiment of the present disclosure.
Figure 8:
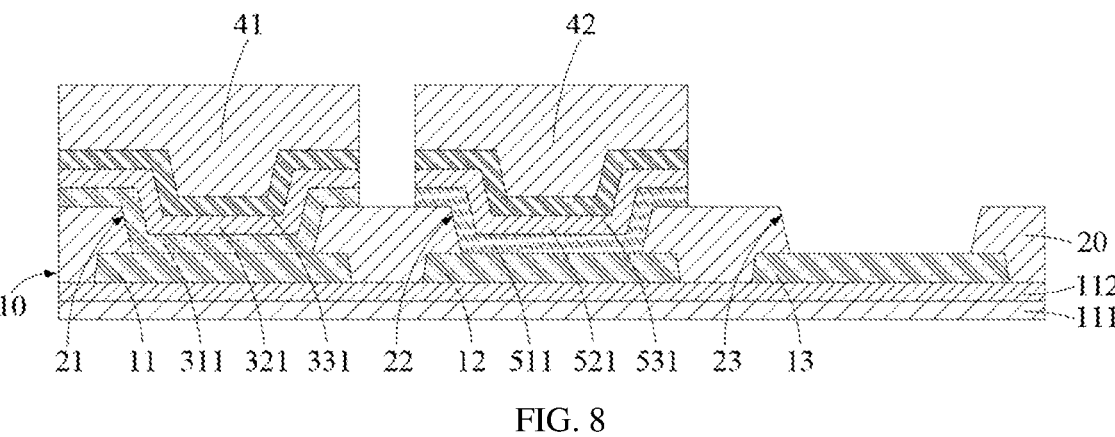
FIG. 8 is a schematic diagram after etching a second light-emitting material layer, a second conductive layer, and a second inorganic layer according to an embodiment of the present disclosure.

S500, refer to FIG. 7, a second organic encapsulation layer 42 is formed on the second inorganic layer 53. The second organic encapsulation layer 42 is arranged corresponding to the second anode 12. Referring to FIG. 8, by taking the second organic encapsulation layer 42 as an etching barrier layer, the second light-emitting material layer 51, the second conductive layer 52, and the second inorganic layer 53 are subjected to an etching treatment to obtain a second light-emitting layer 511, a second cathode 521, and a second inorganic encapsulation layer 531 corresponding to the second anode 12.

It is understandable that serving the second organic encapsulation layer 42 as the etching barrier layer to perform the etching treatment on the second light-emitting material layer 51, the second conductive layer 52, and the second inorganic layer 53 is equivalent to omitting the use of a mask in patterning processes of the second light-emitting material layer 51, the second conductive layer 52, and the second inorganic layer 53. Thus, a manufacturing cost can be saved, and a problem of a large offset between a film forming position and a preset position of a film layer caused by the use of a mask is prevented.

Exemplarily, the second organic encapsulation layer 42 can be formed on the second inorganic layer 53 by using an inkjet printing method. It can be understood that, by setting programs in an inkjet printer, the patterned second organic encapsulation layer 42 can be directly formed in a setting region.

Exemplarily, material of the second organic encapsulation layer 42 may be one or more of polymethyl methacrylate (PMMA) and epoxy resin.

Exemplarily, the second light-emitting material layer 51, the second conductive layer 52, and the second inorganic layer 53 may be subjected to the etching treatment by dry etching, wet etching, or a combination of dry etching and wet etching.

Figure 9:
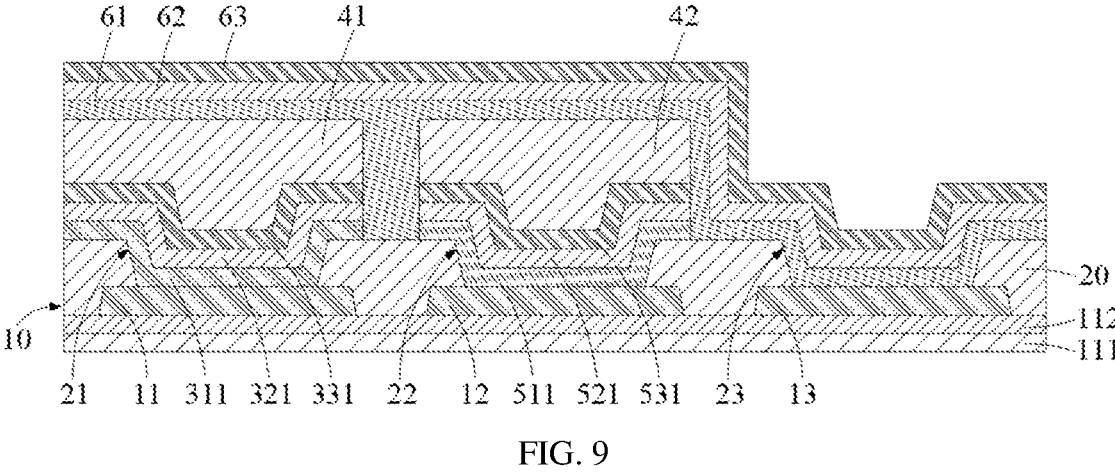
FIG. 9 is a schematic diagram of depositing a third light-emitting material layer, a third conductive layer, and a third inorganic layer according to an embodiment of the present disclosure.

S600, refer to FIG. 9, a third light-emitting material layer 61, a third conductive layer 62, and a third inorganic layer 63 are sequentially deposited on the first organic encapsulation layer 41, the second organic encapsulation layer 42, the anode layer, and the pixel definition layer 20. Light-emitting colors of the first light-emitting material layer 31, the second light-emitting material layer 51, and the third light-emitting material layer 61 are different from each other.

It can be understood that the third light-emitting material layer 61, the third conductive layer 62, and the third inorganic layer 63 are formed on the whole surface, and a mask is not required.

Exemplarily, the third light-emitting material layer 61 can be formed by means of evaporation, coating, or printing.

Exemplarily, the third conductive layer 62 can be formed by means of evaporation, coating, or printing.

Exemplarily, material of the third conductive layer 62 may be metals. In some embodiments, the third conductive layer 62 may be a single-layer structure, and material of the single-layer structure may be a magnesium-silver alloy. In other embodiments, the third conductive layer 62 may be a double-layer structure, and the double-layer structure may include a silver layer and an indium zinc oxide (IZO) layer.

Exemplarily, the third inorganic layer 63 may be formed by methods such as plasma enhanced chemical vapor deposition (PECVD), sputtering, atomic layer deposition (ALD).

Exemplarily, material of the third inorganic layer 63 may be one or more of silicon nitride (SiNx), silicon oxide (SiOx), and silicon oxynitride (SiOxNy).

Exemplarily, the light-emitting colors of the first light-emitting material layer 31, the second light-emitting material layer 51, and the third light-emitting material layer 61 may each be one of red, green, and blue.

In some embodiments, the light-emitting color of the first light-emitting material layer 31 may be red, the light-emitting color of the second light-emitting material layer 51 may be green, and the light-emitting color of the third light-emitting material layer 61 may be blue.

In some embodiments, the light-emitting color of the first light-emitting material layer 31 may be red, the light-emitting color of the second light-emitting material layer 51 may be blue, and the light-emitting color of the third light-emitting material layer 61 may be green.

In some embodiments, the light-emitting color of the first light-emitting material layer 31 may be green, the light-emitting color of the second light-emitting material layer 51 may be red, and the light-emitting color of the third light-emitting material layer 61 may be blue.

In some embodiments, the light-emitting color of the first light-emitting material layer 31 may be green, the light-emitting color of the second light-emitting material layer 51 may be blue, and the light-emitting color of the third light-emitting material layer 61 may be red.

In some embodiments, the light-emitting color of the first light-emitting material layer 31 may be blue, the light-emitting color of the second light-emitting material layer 51 may be red, and the light-emitting color of the third light-emitting material layer 61 may be green.

In some embodiments, the light-emitting color of the first light-emitting material layer 31 may be blue, the light-emitting color of the second light-emitting material layer 51 may be green, and the light-emitting color of the third light-emitting material layer 61 may be red.

In the embodiments of the present disclosure, the first light-emitting material layer 31, the second light-emitting material layer 51, and the third light-emitting material layer 61 are conventional materials in the art, and will not be repeated here. For example, when the light-emitting colors of the first light-emitting material layer 31, the second light-emitting material layer 51, and the third light-emitting material layer 61 are respectively red, green, and blue, the materials of the first light-emitting material layer 31, the second light-emitting material layer 51, and the third light-emitting material layer 61 are a red light-emitting material, a green light-emitting material, and a blue light-emitting material, respectively.

Figure 10:
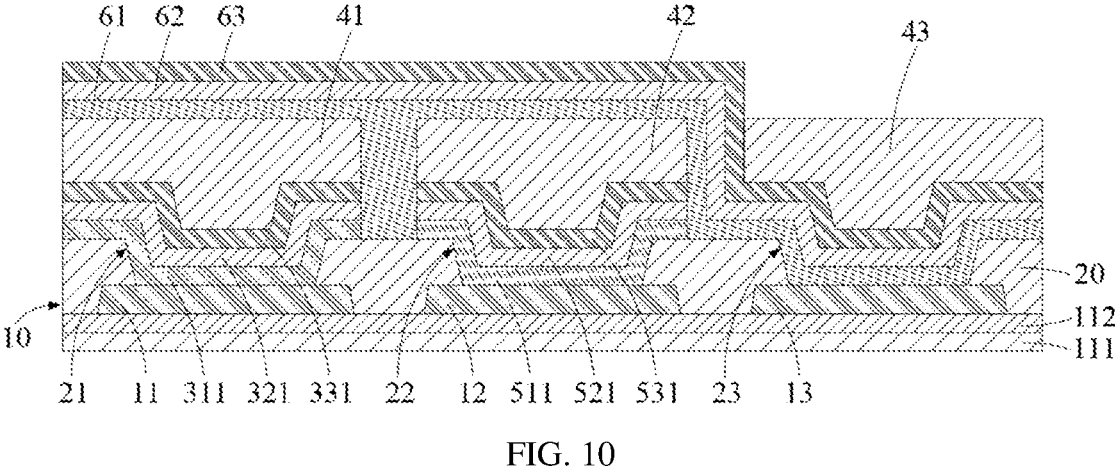
FIG. 10 is a schematic diagram of forming a third organic encapsulation layer on a third inorganic layer according to an embodiment of the present disclosure.
Figure 11:
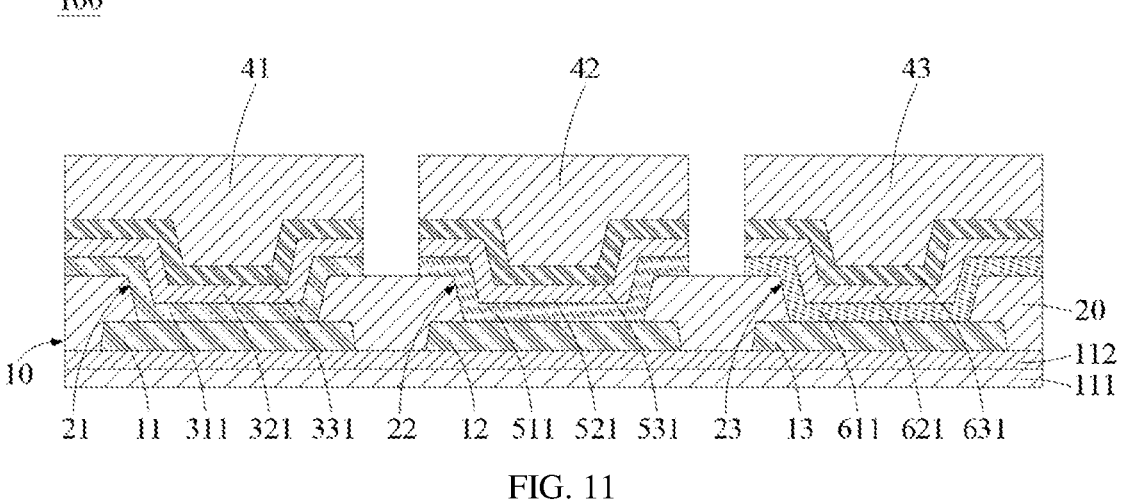
FIG. 11 is a schematic diagram after etching a third light-emitting material layer, a third conductive layer, and a third inorganic layer according to an embodiment of the present disclosure, and shows a structure of a corresponding OLED display panel.

S700, refer to FIG. 10, a third organic encapsulation layer 43 is formed on the third inorganic layer 63, and the third organic encapsulation layer 43 is arranged corresponding to the third anode 13. Referring to FIG. 11, by taking the third organic encapsulation layer 43 as an etching barrier layer, the third light-emitting material layer 61, the third conductive layer 62, and the third inorganic layer 63 are subjected to an etching treatment to obtain a third light-emitting layer 611, a third cathode 621, and a third inorganic encapsulation layer 631 corresponding to the third anode 13, so as to obtain the OLED display panel 100.

It is understandable that serving the third organic encapsulation layer 43 as the etching barrier layer to perform the etching treatment on the third light-emitting material layer 61, the third conductive layer 62, and the third inorganic layer 63 is equivalent to omitting the use of a mask in patterning processes of the third light-emitting material layer 61, the third conductive layer 62, and the third inorganic layer 63. Thus, a manufacturing cost can be saved, and a problem of a large offset between a film forming position and a preset position of a film layer caused by the use of a mask is prevented.

Exemplarily, the third organic encapsulation layer 43 can be formed on the third inorganic layer 63 by using an inkjet printing method. It can be understood that, by setting programs in an inkjet printer, the patterned third organic encapsulation layer 43 can be directly formed in a setting region.

Exemplarily, the material of the third organic encapsulation layer 43 may be one or more of polymethyl methacrylate (PMMA) and epoxy resin.

Exemplarily, the third light-emitting material layer 61, the third conductive layer 62, and the third inorganic layer 63 may be subjected to the etching treatment by dry etching, wet etching, or a combination of dry etching and wet etching.

Figure 12:
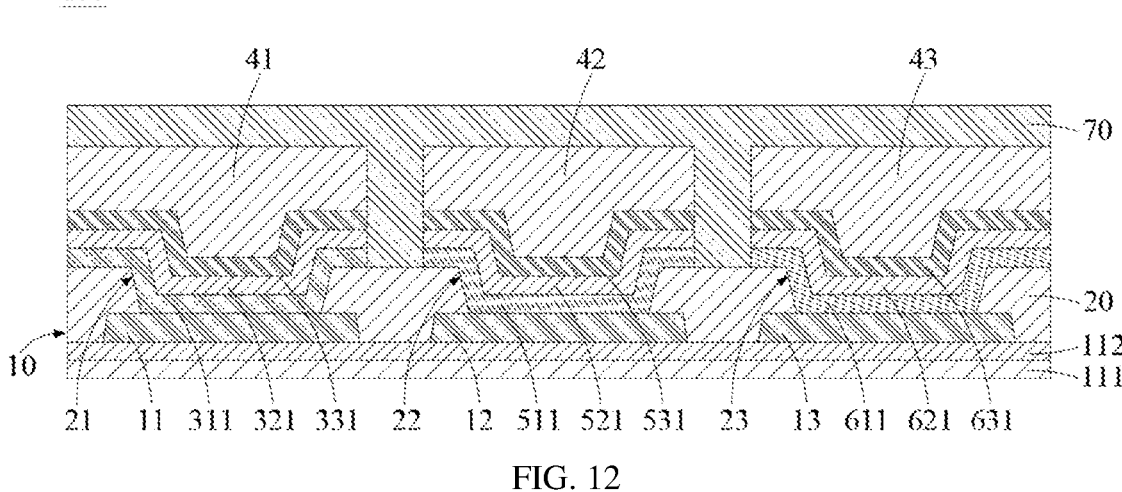
FIG. 12 is a schematic diagram after forming a fourth inorganic encapsulation layer according to an embodiment of the present disclosure, and shows a structure of a corresponding OLED display panel.

Referring to FIG. 12, in step S700, after obtaining the third light-emitting layer 611, the third cathode 621, and the third inorganic encapsulation layer 631 corresponding to the third anode 13, a fourth inorganic encapsulation layer 70 may also be formed on the first organic encapsulation layer 41, the second organic encapsulation layer 42, the third organic encapsulation layer 43, and the pixel definition layer 20.

It can be understood that the fourth inorganic encapsulation layer 70 is formed on the whole surface without using a mask.

Exemplarily, the material of the fourth inorganic encapsulation layer 70 includes one or more of silicon nitride (SiNx), silicon oxide (SiOx), and silicon oxynitride (SiOxNy).

It can be understood that by setting the fourth inorganic encapsulation layer 70, on the basis of encapsulating and protecting a first OLED device by using the first inorganic encapsulation layer 331 and the first organic encapsulation layer 41, encapsulating and protecting a second OLED device by using the second inorganic encapsulation layer 531 and the second organic encapsulation layer 42, and encapsulating and protecting a third OLED device by using the third inorganic encapsulation layer 631 and the third organic encapsulation layer 43, the fourth inorganic encapsulation layer 70 is used to add a layer of protection to the first OLED device, the second OLED device, and the third OLED device, thereby further blocking the entry of water and oxygen to the first OLED device, the second OLED device, and the third OLED device.

Exemplarily, the fourth inorganic encapsulation layer 70 may be formed by a process such as plasma enhanced chemical vapor deposition (PECVD), sputtering, and atomic layer deposition (ALD).

It can be understood that, in the OLED display panel 100 of the embodiments of the present disclosure, the first anode 11, the first light-emitting layer 311, and the first cathode 321 arranged in layers can together form the first OLED device, and the first inorganic encapsulation layer 331 and the first organic encapsulation layer 41 arranged in layers together form an encapsulation structure of the first OLED device.

The second anode 12, the second light-emitting layer 511, and the second cathode 521 arranged in layers can together form the second OLED device. The second inorganic encapsulation layer 531 and the second organic encapsulation layer 42 arranged in layers together form an encapsulation structure of the second OLED device.

The third anode 13, the third light-emitting layer 611, and the third cathode 621 arranged in layers can together form the third OLED device. The third inorganic encapsulation layer 631 and the third organic encapsulation layer 43 arranged in layers together form an encapsulation structure of the third OLED device.

When the light-emitting colors of the first light-emitting layer 311, the second light-emitting layer 511, and the third light-emitting layer 611 are respectively red, green, and blue, the first OLED device, the second OLED device, and the third OLED device are OLED devices that emit red light, green light, and blue light, respectively. Color images of the OLED display panel 100 can be formed by a combination of red light, green light, and blue light.

In summary, in the manufacturing method of the OLED display panel of the embodiments of the present disclosure, by taking the first organic encapsulation layer 41 as the etching barrier layer, the first light-emitting material layer 31, the first conductive layer 32, and the first inorganic layer 33 are subjected to the etching treatment to obtain the first light-emitting layer 311, the first cathode 321, and the first inorganic encapsulation layer 331. By taking the second organic encapsulation layer 42 as the etching barrier layer, the second light-emitting material layer 51, the second conductive layer 52, and the second inorganic layer 53 are subjected to the etching treatment to obtain the second light-emitting layer 511, the second cathode 521, and the second inorganic encapsulation layer 531. By taking the third organic encapsulation layer 43 as the etching barrier layer, the third light-emitting material layer 61, the third conductive layer 62, and the third inorganic layer 63 are subjected to the etching treatment to obtain the third light-emitting layer 611, the third cathode 621, and the third inorganic encapsulation layer 631. That is, in the embodiments of the present disclosure, no mask is used in processes of forming the first light-emitting layer 311, the second light-emitting layer 511, the third light-emitting layer 611, the first cathode 321, the second cathode 521, the third cathode 621, the first inorganic encapsulation layer 331, the second inorganic encapsulation layer 531, and the third inorganic encapsulation layer 631, so that a manufacturing cost of the OLED display panel 100 can be reduced. Moreover, a problem of a large offset between a film forming position and a preset position of a film layer caused by the use of a mask is prevented.

In an existing manufacturing method of an OLED display panel, due to the use of a mask, not only a manufacturing cost is high and a film formation position of a film layer is offset, but also foreign particles are introduced into the OLED display panel due to the foreign particles carried by the mask and the particles generated when the mask collides and rubs against a substrate. Moreover, when the mask collides and rubs against the substrate, the substrate is easily scratched, which reduces a production yield of the OLED display panel. In addition, when the mask is used for vapor deposition, the vapor deposition material is easily diffused from gaps of the mask, so that an edge area of the display panel that should not be coated with a film layer is also coated with the film layer. In order to prevent this portion of the area from affecting the display performance, this portion of the area needs to be shielded, which is not conducive to realizing a narrow bezel design of the OLED display panel. The embodiments of the present disclosure can prevent the problem of introducing foreign particles in the OLED display panel by omitting the use of a mask in the manufacturing method of the OLED display panel. At the same time, the problem that the OLED display panel is scratched by the mask is prevented, and the production yield is improved. Furthermore, it is also beneficial to realize a narrow bezel design of the OLED display panel.

Referring to FIG. 11 and FIG. 12, an embodiment of the present disclosure further provides an OLED display panel 100. The OLED display panel 100 can be manufactured by the manufacturing method of the OLED display panel in any of the above embodiments. The OLED display panel 100 may include a substrate 111, a driving layer 112, a first OLED device, a second OLED device, a third OLED device, a pixel definition layer 20, a first encapsulation structure, a second encapsulation structure, and a third encapsulation structure.

The driving layer 112 is disposed on a side of the substrate 111. The first OLED device is disposed on a side of the driving layer 112 away from the substrate 111. The first OLED device includes a first anode 11, a first light-emitting layer 311, and a first cathode 321 that are stacked in sequence. The second OLED device is disposed on a side of the driving layer 112 away from the substrate 111. The second OLED device includes a second anode 12, a second light-emitting layer 511, and a second cathode 521 which are stacked in sequence. The third OLED device is disposed on a side of the driving layer 112 away from the substrate 111. The third OLED device includes a third anode 13, a third light-emitting layer 611, and a third cathode 621 that are stacked in sequence. Light-emitting colors of the first light-emitting layer 311, the second light-emitting layer 511, and the third light-emitting layer 611 are different.

The pixel definition layer is disposed on a side of the driving layer 112 away from the substrate 111. The pixel definition layer 20 is disposed in a spaced region between the first OLED device, the second OLED device, and the third OLED device;

The first encapsulation structure is disposed on a side of the first OLED device away from the driving layer 112, and the first encapsulation structure includes a first inorganic encapsulation layer 331 and a first organic encapsulation layer 41 arranged in layers.

The second encapsulation structure is disposed on a side of the second OLED device away from the driving layer 112, and the second encapsulation structure includes a second inorganic encapsulation layer 531 and a second organic encapsulation layer 42 arranged in layers.

The third encapsulation structure is disposed on a side of the third OLED device away from the driving layer 112, and the third encapsulation structure includes a third inorganic encapsulation layer 631 and a third organic encapsulation layer 43 arranged in layers.

Exemplarily, the light-emitting colors of the first light-emitting layer 311, the second light-emitting layer 511, and the third light-emitting layer 611 may each be one of red, green, and blue.

In some embodiments, the light-emitting color of the first light-emitting layer 311 may be red, the light-emitting color of the second light-emitting layer 511 may be green, and the light-emitting color of the third light-emitting layer 611 may be blue.

In some embodiments, the light-emitting color of the first light-emitting layer 311 may be red, the light-emitting color of the second light-emitting layer 511 may be blue, and the light-emitting color of the third light-emitting layer 611 may be green.

In some embodiments, the light-emitting color of the first light-emitting layer 311 may be green, the light-emitting color of the second light-emitting layer 511 may be red, and the light-emitting color of the third light-emitting layer 611 may be blue.

In some embodiments, the light-emitting color of the first light-emitting layer 311 may be green, the light-emitting color of the second light-emitting layer 511 may be blue, and the light-emitting color of the third light-emitting layer 611 may be red.

In some embodiments, the light-emitting color of the first light-emitting layer 311 may be blue, the light-emitting color of the second light-emitting layer 511 may be red, and the light-emitting color of the third light-emitting layer 611 may be green.

In some embodiments, the light-emitting color of the first light-emitting layer 311 may be blue, the light-emitting color of the second light-emitting layer 511 may be green, and the light-emitting color of the third light-emitting layer 611 may be red.

Exemplarily, the materials of the first inorganic encapsulation layer 331, the second inorganic encapsulation layer 531, and the third inorganic encapsulation layer 631 may each include one or more of silicon nitride, silicon oxide, and silicon oxynitride.

Exemplarily, material of the first organic encapsulation layer 41, material of the second organic encapsulation layer 42, and material of the third organic encapsulation layer 43 each include either one or both of polymethyl methacrylate and epoxy resin.

Referring to FIG. 12, the OLED display panel 100 may further include a fourth inorganic encapsulation layer 70. The fourth inorganic encapsulation layer 70 is disposed on a side the first organic encapsulation layer 41, the second organic encapsulation layer 42, the third organic encapsulation layer 43, and the pixel definition layer 20 away from the driving layer 112.

Exemplarily, material of the fourth inorganic encapsulation layer 70 may include one or more of silicon nitride, silicon oxide, and silicon oxynitride.

The manufacturing method of the OLED display panel and the OLED display panel provided by the embodiments of the present disclosure are described in detail above. The principles and implementations of the present disclosure are described herein by using specific examples, and the descriptions of the above examples are only used to help understand the present disclosure. At the same time, for those skilled in the art, according to the idea of the present disclosure, there will be changes in the specific implementation manner and application scope. To sum up, the content of this specification should not be construed as a limitation on the present disclosure.

What is claimed is:

1. A manufacturing method of an organic light-emitting diode (OLED) display panel, comprising:
    providing a driving substrate, wherein the driving substrate comprises a substrate, a driving layer, an anode layer, and a pixel definition layer that are stacked in sequence, the anode layer comprises a first anode, a second anode, and a third anode arranged at intervals, the pixel definition layer is provided with a first opening, a second opening and a third opening arranged at intervals, and the first opening, the second opening, and the third opening respectively correspond to the first anode, the second anode, and the third anode to expose the first anode, the second anode, and the third anode;

depositing a first light-emitting material layer, a first conductive layer, and first inorganic layer in sequence on the anode layer and the pixel definition layer;

forming a first organic encapsulation layer on the first inorganic layer, wherein the first organic encapsulation layer is arranged corresponding to the first anode, and by taking the first organic encapsulation layer as an etching barrier layer, the first light-emitting material layer, the first conductive layer, and the first inorganic layer are subjected to an etching treatment to obtain a first light-emitting layer, a first cathode, and a first inorganic encapsulation layer corresponding to the first anode;

depositing a second light-emitting material layer, a second conductive layer, and a second inorganic layer in sequence on the first organic encapsulation layer, the anode layer, and the pixel definition layer;

forming a second organic encapsulation layer on the second inorganic layer, wherein the second organic encapsulation layer is arranged corresponding to the second anode, and by taking the second organic encapsulation layer as an etching barrier layer, the second light-emitting material layer, the second conductive layer, and the second inorganic layer are subjected to an etching treatment to obtain a second light-emitting layer, a second cathode, and a second inorganic encapsulation layer corresponding to the second anode;

depositing a third light-emitting material layer, a third conductive layer, and a third inorganic layer in sequence on the first organic encapsulation layer, the second organic encapsulation layer, the anode layer, and the pixel definition layer, wherein light-emitting colors of the first light-emitting material layer, the second light-emitting material layer, and the third light-emitting material layer are different from each other; and forming a third organic encapsulation layer on the third inorganic layer, wherein the third organic encapsulation layer is arranged corresponding to the third anode, and by taking the third organic encapsulation layer as an etching barrier layer, the third light-emitting material layer, the third conductive layer, and the third inorganic layer are subjected to an etching treatment to obtain a third light-emitting layer, a third cathode, and a third inorganic encapsulation layer corresponding to the third anode, so as to obtain the OLED display panel.

2. The manufacturing method of the OLED display panel according to claim 1, wherein the first organic encapsulation layer is formed on the first inorganic layer by an inkjet printing method, the second organic encapsulation layer is formed on the second inorganic layer by the inkjet printing method, and the third organic encapsulation layer is formed on the third inorganic layer by the inkjet printing method.

3. The manufacturing method of the OLED display panel according to claim 1, wherein material of the first organic encapsulation layer comprises either one or both of polymethyl methacrylate and epoxy resin.

4. The manufacturing method of the OLED display panel according to claim 1, wherein material of the second organic encapsulation layer comprises either one or both of polymethyl methacrylate and epoxy resin.

5. The manufacturing method of the OLED display panel according to claim 1, wherein material of the third organic encapsulation layer comprises either one or both of polymethyl methacrylate and epoxy resin.

6. The manufacturing method of the OLED display panel according to claim 1, wherein the first light-emitting material layer, the second light-emitting material layer, and the third light-emitting material layer are formed by means of evaporation, coating, or printing.

7. The manufacturing method of the OLED display panel according to claim 1, wherein the first conductive layer, the second conductive layer, and the third conductive layer are formed by means of evaporation, coating, or printing.

8. The manufacturing method of the OLED display panel according to claim 1, wherein the first inorganic layer, the second inorganic layer, and the third inorganic layer are formed by means of plasma enhanced chemical vapor deposition, sputtering, or atomic layer deposition.

9. The manufacturing method of the OLED display panel according to claim 1, wherein materials of the first inorganic layer, the second inorganic layer, and the third inorganic layer each comprise one or more of silicon nitride, silicon oxide, and silicon oxynitride.

10. The manufacturing method of the OLED display panel according to claim 1, wherein after obtaining the third light-emitting layer, the third cathode, and the third inorganic encapsulation layer corresponding to the third anode, a fourth inorganic encapsulation layer is formed on the first organic encapsulation layer, the second organic encapsulation layer, the third organic encapsulation layer, and the pixel definition layer.

11. The manufacturing method of the OLED display panel according to claim 10, wherein material of the fourth inorganic encapsulation layer comprises one or more of silicon nitride, silicon oxide, and silicon oxynitride.

12. An organic light-emitting diode (OLED) display panel, comprising:

a substrate;

a driving layer disposed on a side of the substrate;

a first OLED device disposed on a side of the driving layer away from the substrate, wherein the first OLED device comprises a first anode, a first light-emitting layer, and a first cathode that are stacked in sequence;

a second OLED device disposed on a side of the driving layer away from the substrate, wherein the second OLED device comprises a second anode, a second light-emitting layer, and a second cathode that are stacked in sequence;

a third OLED device disposed on a side of the driving layer away from the substrate, wherein the third OLED device comprises a third anode, a third light-emitting layer, and a third cathode that are stacked in sequence, and light-emitting colors of the first light-emitting layer, the second light-emitting layer, and the third light-emitting layer are different from each other;

a pixel definition layer disposed on a side of the driving layer away from the substrate, wherein the pixel definition layer is disposed in a spaced region between the first OLED device, the second OLED device, and the third OLED device;

a first encapsulation structure, wherein the first encapsulation structure is disposed on a side of the first OLED device away from the driving layer, and the first encapsulation structure comprises a first inorganic encapsulation layer and a first organic encapsulation layer arranged in layers;

a second encapsulation structure, wherein the second encapsulation structure is disposed on a side of the second OLED device away from the driving layer, and the second encapsulation structure comprises a second inorganic encapsulation layer and a second organic encapsulation layer arranged in layers; and a third encapsulation structure, wherein the third encapsulation structure is disposed on a side of the third OLED device away from the driving layer, and the third encapsulation structure comprises a third inorganic encapsulation layer and a third organic encapsulation layer arranged in layers.

13. The OLED display panel according to claim 12, wherein material of the first inorganic encapsulation layer comprises one or more of silicon nitride, silicon oxide, and silicon oxynitride.

14. The OLED display panel according to claim 12, wherein material of the second inorganic encapsulation layer comprises one or more of silicon nitride, silicon oxide, and silicon oxynitride.

15. The OLED display panel according to claim 12, wherein material of the third inorganic encapsulation layer comprises one or more of silicon nitride, silicon oxide, and silicon oxynitride.

16. The OLED display panel according to claim 12, wherein material of the first organic encapsulation layer comprises either one or both of polymethyl methacrylate and epoxy resin.

17. The OLED display panel according to claim 12, wherein material of the second organic encapsulation layer comprises either one or both of polymethyl methacrylate and epoxy resin.

18. The OLED display panel according to claim 12, wherein material of the third organic encapsulation layer comprises either one or both of polymethyl methacrylate and epoxy resin.

19. The OLED display panel according to claim 12, further comprising a fourth inorganic encapsulation layer, wherein the fourth inorganic encapsulation layer is disposed on a side of the first organic encapsulation layer, the second organic encapsulation layer, the third organic encapsulation layer, and the pixel definition layer away from the driving layer.

20. The OLED display panel according to claim 19, wherein material of the fourth inorganic encapsulation layer comprises one or more of silicon nitride, silicon oxide and silicon oxynitride.

* * * * *